(12) United States Patent
Johnson

(10) Patent No.: US 6,425,953 B1
(45) Date of Patent: Jul. 30, 2002

(54) ALL-SURFACE BIASABLE AND/OR TEMPERATURE-CONTROLLED ELECTROSTATICALLY-SHIELDED RF PLASMA SOURCE

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/530,946

(22) PCT Filed: Nov. 13, 1998

(86) PCT No.: PCT/US98/23248

§ 371 (c)(1),
(2), (4) Date: Jun. 29, 2000

(87) PCT Pub. No.: WO99/25494

PCT Pub. Date: May 27, 1999

Related U.S. Application Data

(60) Provisional application No. 60/065,794, filed on Nov. 14, 1997.

(51) Int. Cl.[7] .............................. B08B 7/00; B08B 7/04; C23C 16/00
(52) U.S. Cl. ........................... 134/1; 134/1.1; 134/22.1; 134/22.18; 438/905; 118/723 I; 118/723 R; 156/345
(58) Field of Search ........................... 134/1, 1.1, 22.1, 134/22.18; 438/905; 118/723 R, 723 I; 156/345

(56) References Cited

U.S. PATENT DOCUMENTS

| 4,786,352 A | 11/1988 | Benzing |
| 4,918,031 A | 4/1990 | Flamm et al. |
| 5,234,529 A | 8/1993 | Johnson |
| 5,514,246 A | 5/1996 | Blalock |
| 5,523,261 A | 6/1996 | Sandhu |
| 5,647,913 A | 7/1997 | Blalock |

FOREIGN PATENT DOCUMENTS

| WO | WO 99/25494 | * 5/1999 |

* cited by examiner

*Primary Examiner*—Alexander Markoff
(74) *Attorney, Agent, or Firm*—Oblon, Spivak, McClelland, Maier & Neustadt, P.C.

(57) ABSTRACT

A plasma processing system and method for producing a cleaner and more controlled environment for processing substrates such as semiconductor wafers. The plasma processing system includes a process chamber including an inner and an outer wall, a heating element thermally coupled to the inner wall of the process chamber, a bias shield, and an electrostatic shield. The processing system also includes an inductive coil surrounding the process chamber for coupling RF power to the gas inside the process chamber, thereby producing a plasma. RF power can also be applied to a wafer holder, such as an electrostatic chuck which can also be heated or cooled. The method of cleaning such a plasma processing system includes applying a bias voltage to the bias shield, heating the process chamber using the heater element, and cleaning the internal surfaces—starting with the largest surface and progressing to the smallest surface.

9 Claims, 8 Drawing Sheets

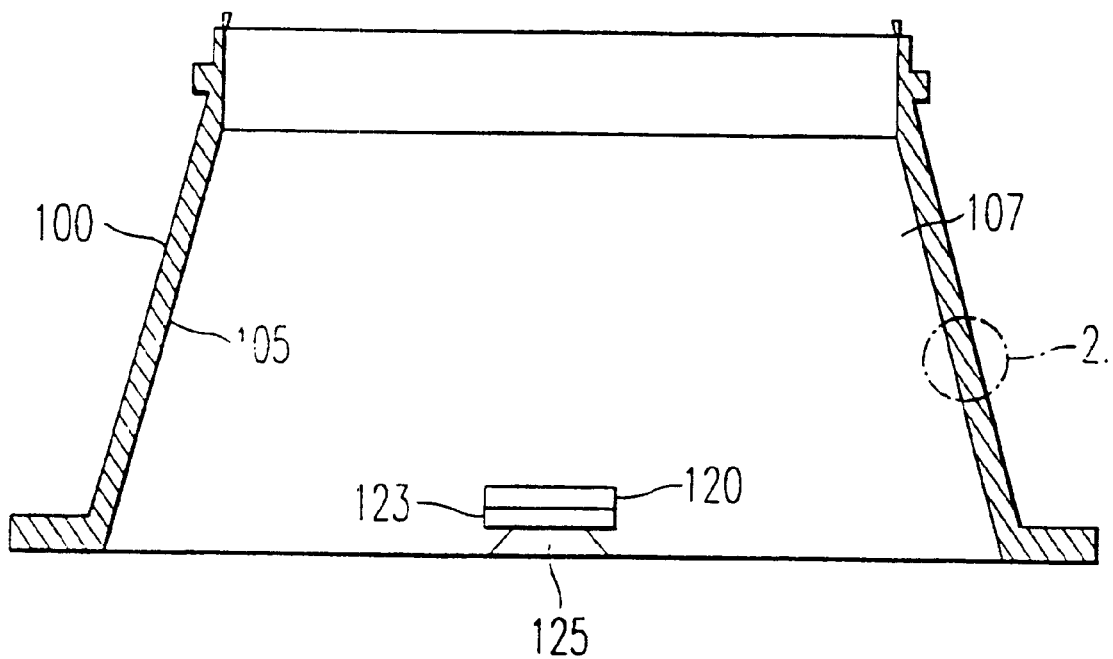

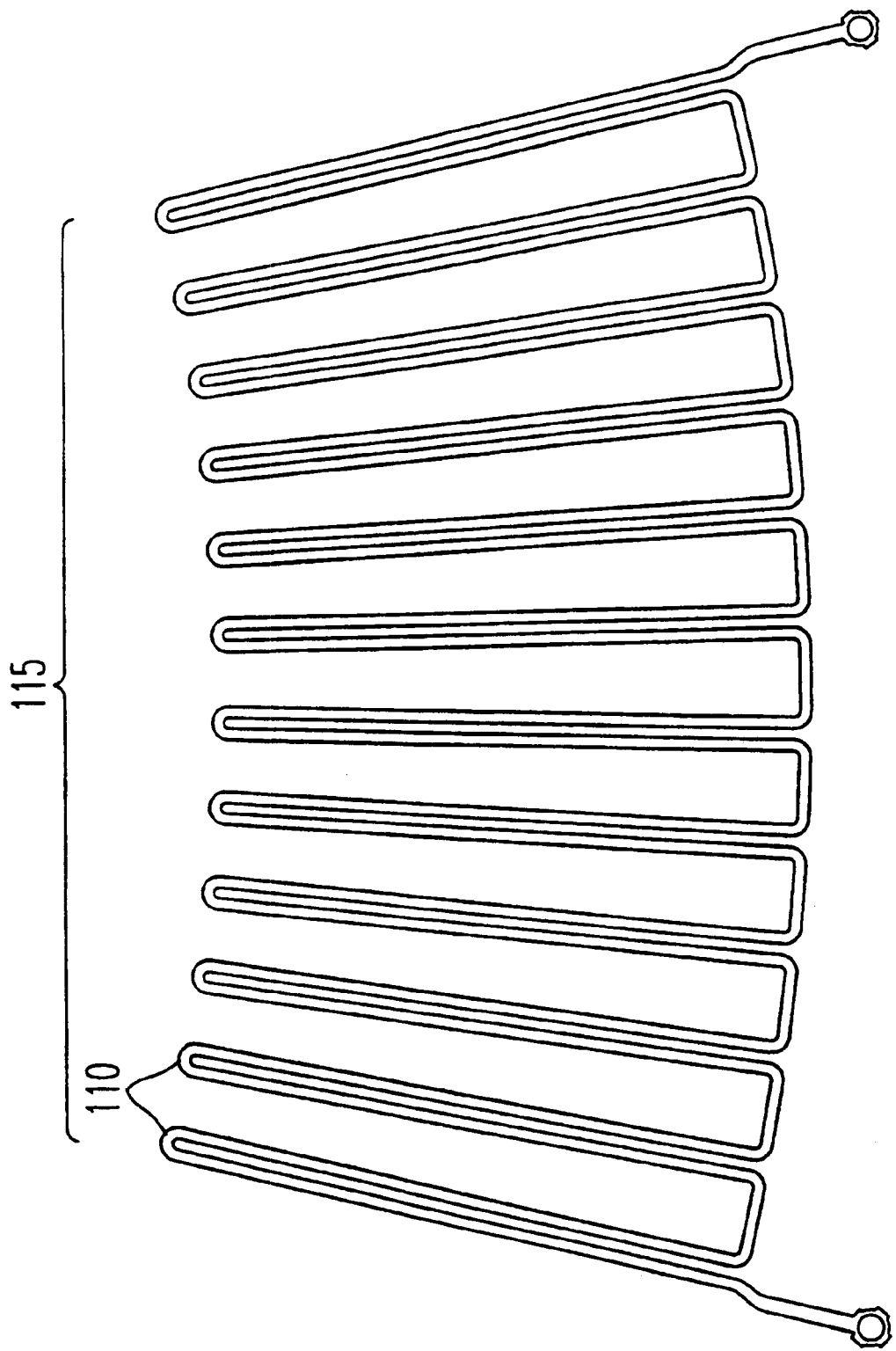

ALL-SURFACE BIASABLE AND/OR TEMPERATURE-CONTROLLED ELECTROSTATICALLY-SHIELDED RF PLASMA SOURCE

CROSS-REFERENCE TO CO-PENDING APPLICATION

The present application is related to and claims priority to U.S. Provisional Application Ser. No. 60/065,794, filed Nov. 14, 1997. The contents of that provisional application are incorporated herein by reference.

BACKGROUND OF THE INVENTION

1. Field of the Invention

The present invention is directed to an improved plasma processing system, and particularly to a plasma processing system in which all surfaces of the system can be biased electrically and/or can be heated or cooled to improve the overall cleanliness of the system. The present invention can also control the wall coatings to be the proper amount to positively effect the process. The present invention also is directed to the process of cleaning such a processing system.

2. Description of the Background

High-density plasma processing systems are used for plasma etching and/or depositing thin films. Different parts of the plasma sources of the system are coated with condensable species generated during the plasma etching and deposition processes. The species deposited on various surfaces of the source affect the gas chemistry of the plasma source in various ways. For example, some deposits getter (i.e., remove from a gas) reactive species from the plasma, thus lowering etching and deposition rates. Other species on source surfaces, while they are condensable, also have high-enough vapor pressures that they can be desorbed from source surfaces, thereby changing the gas composition of the plasma. Gas species that adsorb on the wall are often radicals and polymerize with existing wall coatings to create species with must different vapor pressure and/or reactivity. Gas species that are condensed on the walls can also be crosslinked by electrons, ions or photon fluxes from the plasma to generate much different vapor pressure and/or reactivity species. Changes in the gas composition of the plasma by gettering, desorption of condensed species. or any other means, particularly in unregulated ways, results in loss of control of the of the total process. Herein, changes in the gas composition by any of these processes will be described generally as changes due to "wall contributions to process gas."

Particle contamination has become an ever increasing problem as the complexity of integrated circuits increases and the feature size of these circuits decreases. Although clean-rooms had already greatly reduced contamination due to the ambient atmosphere by 1990, it was generally recognized by that time that processing tools and the processes themselves were major contributors of particle contamination. See Selwyn et al., Appl. Phys. Lett, 57 (18) 1876–8 (1990). Plasma processors had already been identified as major sources of contamination. See Selwyn et al., J. Vac. Sci. & Technol. A, 7 (4) 2758–65 (1989); Selwyn et al., 1990; Selwyn et al., J. Vac. Sci. & Technol. A, 9 (5) 2817–24 (1991(a)); and Selwyn, J. Vac. Sci. & Technol. A, 9 (6) 3487–92 (1991(b)). By 1990, suspended particles had been observed at the plasma/sheath boundary in plasmas used to etch, (see Selwyn et al., 1989), deposit (see Spears et al., IEEE Trans. Plasma Science, PS-14 (2) 179–87 (1986)) and sputter (see Jellum et al., J. Appl. Phys., 67 (10) 6490–6 (1990(a))). These suspended particles become negatively charged (see Wu, et al., J. Appl. Phys., 67 (2) 1051–4 (1990) and Nowlin, J. Vac. Sci. & Technol. A, 9 (5) 2825–33 (1991)) in the plasma and become trapped at the plasma/sheath boundary (Selwyn et al., 1990 and Carlile, Appl. Phys. Lett., 59 (10) 1167–9 (1991)).

When the plasma is extinguished, the particles may fall onto the wafer surface, thereby contaminating it. By 1992, it was believed that 70% to 80% of total wafer contamination was contributed by tools and processes used in device fabrication, and plasma processors are among the "dirtiest" tools in modern fab lines. See Selwyn, J. Vac. Sci. & Technol. A, 10 (4) 1053–9 (1992).

Consequently, much attention has been directed to controlling particle generation in plasma processors and the cleaning of such reactors. However, the influence of process parameters and chamber design on both the reduction of wall deposits and in-situ reactor cleaning has been considered (see Vogt et al., Surface & Coatings Technol., 59 (1–3) 306–9 (1993)); and the control of particulate contamination by means of a self-cleaning tool design has been described (see Selwyn et al., 1992). The optimization of in-situ cleaning procedures using fluorinated reactive gases has recently been considered. See Sobelewski et al., J. Vac. Sci. & Technol. B, 16 (1) 173–82 (1998); Ino et al., Japanese J. Appl. Phys. 33 Pt. 1 (1B) 505–9 (1994) and Ino et al., IEEE Trans. on Semicon. Mfg., 9 (2) 230–40 (1996).

Yoneda (U.S. Pat. No. 4,430,547) describes an in-situ self-cleaning parallel plate plasma apparatus in which electrodes are heated by means of embedded resistive heaters or a circulating heated fluid. Benzing (U.S. Pat. No. 4,657,616) and Krucowski (U.S. Pat. No. 4,786,392) describe an inconvenient set of removable fixtures which must be placed inside the process chamber when cleaning becomes necessary and removed when cleaning has been completed. Benzing (U.S. Pat. No. 4,786,352) includes two or more electrodes on the exterior surface of a dielectric processor chamber, and, by applying an RF voltage between the two or more electrodes, establishes a plasma within the chamber for in-situ cleaning. Hayes (U.S. Pat. No. 4,795,880) uses the heating coil of a tube furnace as the inductive heating element by which a cleaning plasma is established within the tube. The cleaning is accomplished at furnace operating temperatures. Law (U.S. Pat. No. 4,960,488) describes a single-wafer processing chamber with the capability of a localized chamber self-etch and a wide area chamber self-etch. Both etches are possible due to the wide range of pressures at which the chamber may be operated and the variable electrode spacing. Aoi (U.S. Pat. No. 5,084,125) describes a processing chamber that has a processing section and a cleaning section. A movable wall is positioned alternately in the processing section and in the cleaning section. Neither chamber disassembly nor process interruption for cleaning is necessary. Moslehi (U.S. Pat. Nos. 5,252,178 and 5,464,499) describes a multi-zone and multielectrode plasma processing system. The apparatus permits activation of the multiple plasma electrodes in either a continuous or multiplexed format. Process gas flows may be stopped intermittently and a cleaning gas introduced so that an in-situ cleaning process occurs. Sekiya (U.S. Pat. No. 5,269, 881) covers the interior surfaces of a parallel plate processing chamber with multiple conducting electrodes which are insulated from each other. A high frequency electric field is applied sequentially between the electrodes in various electrical configurations to achieve in-situ cleaning. Blalock (U.S. Pat. Nos. 5,514,246 and 5,647,913) describes an inductively coupled plasma reactor that includes a capacitive coupling electrode located between the exterior surface of the chamber wall and the induction coil used to excite the plasma. An RF field established between the capacitive coupling electrode and conductors within the chamber produces a cleaning plasma. Sandhu (U.S. Pat. Nos. 5,523,261 and 5,599,396) describes an inductively coupled plasma reactor in which a capacitive coupling electrode is used to facilitate cleaning as in Blalock. However, in contrast to Blalock, the electrode comprises a conducting liquid or a conducting polymer that fills a void between the inner and outer wall of the process chamber and is active only during chamber cleaning.

Grewal (U.S. Pat. Nos. 5,597,438) describes an etch chamber with three independently controlled electrodes. Both inductive and capacitive coupling are used. Usami (UK Patent Application No. 2,308,231) describes a capacitively excited reactor in which the counter electrode is not planar. It may be cleaned by exciting a cleaning plasma with the sample holder being either the powered or grounded electrode. In one embodiment, power at two frequencies is used during the cleaning procedure.

During plasma etching, etch rates vary in uncontrolled ways and a uniformity of etching can be greatly reduced in the presence of wall contribution to process gas. During plasma deposition, deposition rates, the composition of the deposited films, and the uniformity of film deposition are all affected in non-uniform and uncontrolled ways by wall contribution to process gas. Consequently, since the chemistry at surfaces in these sources was not controllable previously, the overall processes being implemented using the sources previously was uncontrolled. These changes in the wall contribution to process gas can change during the processing of a single wafer or over a longer time such generating changes from wafer to wafer.

Heating of the walls of deposition and etch process chambers during etching or deposition to minimize condensation is known. In deposition reactors heating surfaces hot enough to cause chemical reactions enhances the deposition rate of the material that one wishes to deposit, but heating to a temperature short of the chemical reaction threshold promotes desorption of effluents. However, heating all surfaces of a reactor while simultaneously bombarding them with plasma species form volatile compounds of the undesired wall absorbed species has not to our knowledge previously been described. Furthermore, it has not heretofore been possible in reactors that differ from the ESRF source.

Applied Materials, of Santa Clara, Calif. sells an etching reactor that uses fluorine chemistry and employs a heated silicon top plate to convert fluorine radicals (F*) to molecular fluorine ($F_2$) during the etching reactions, but not during cleaning of the reactor. Some other known systems have tried to control chemical changes on individual surfaces during processing, such as is disclosed in Japanese application 61-289634 entitled "Dry etching," in which a polymer is prevented from being formed on an electrode by attaching alumina rings to an outer surface of the electrode; Japanese application 62-324404 entitled "Etching Device," in which a hot water-based heater is attached to a silica chamber to improve etching performance; and Japanese application 63-165812 entitled "Etching Device," in which an electrical heater is attached to a chamber to prevent reaction products from sticking to the surface. The contents of each of these applications is incorporated herein by reference. However, if only selected surfaces have controlled chemistries, then the remaining surfaces which are less reliably controlled control the overall introduction of wall contribution to process gas into their corresponding systems.

Still another problem with known systems is slow cleaning of surfaces within sources using plasma etching. In fact in many reactors the cleaning time significantly exceeds the process time, especially for thickly deposited materials. Such reactors are inherently very cost-ineffective.

Some known systems have utilized electrical biasing of individual components during cleaning, such as is disclosed in U.S. Pat. No. 5,269,881 to Sekiya et al., entitled "Plasma Processing Apparatus and Plasma Cleaning Method", in which a high voltage is applied individually to each of three electrically isolated conductive blocks during cleaning; Japanese application 57-42131 entitled "Parallel Flat Board Type Dry Etching Device," in which the polarity of an electrode is reversed between sputtering and cleaning; Japanese application 60-59739 entitled "Dry Cleaning Method," in which a high frequency power is applied between a substrate electrode and a cleaning electrode to remove a silicon film; and Japanese application 61-10239, entitled "Semiconductor Manufacturing Equipment," in which the grounding self-bias of an anode plate is eliminated during a plasma etching/cleaning process. The contents of each of these applications is incorporated herein by reference. However, as described above in terms of controlling chemistry on surfaces, if only selected surfaces are cleaned, then the remaining surfaces which are less reliably cleaned control the overall uncleanliness of their corresponding systems.

SUMMARY OF THE INVENTION

It is a first object of the present invention to address at least one disadvantage of known plasma processing systems.

It is a second object of the present invention to provide a method for controlling the chemistry at all surfaces of a high-density plasma source.

It is a third object of the present invention to provide an improved method of cleaning a plasma processing system which reduces cleaning time of the plasma sources.

These objects and other objects of the invention are achieved by providing the capability to both regulate a temperature of and to electrically bias, each of the surfaces in the source. This regulation is enabled by using materials for all surfaces in the source which assist in controlling the chemical reactions that occur at each surface.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 1C is a cross-sectional view of a plasma processing chamber according to the present invention where the cross-section has been cut from top to bottom;

FIG. 3B is a sub-section of the heating element of FIG. 3A; and

DETAILED DESCRIPTION OF THE PREFERRED EMBODIMENTS

Figure 1A:
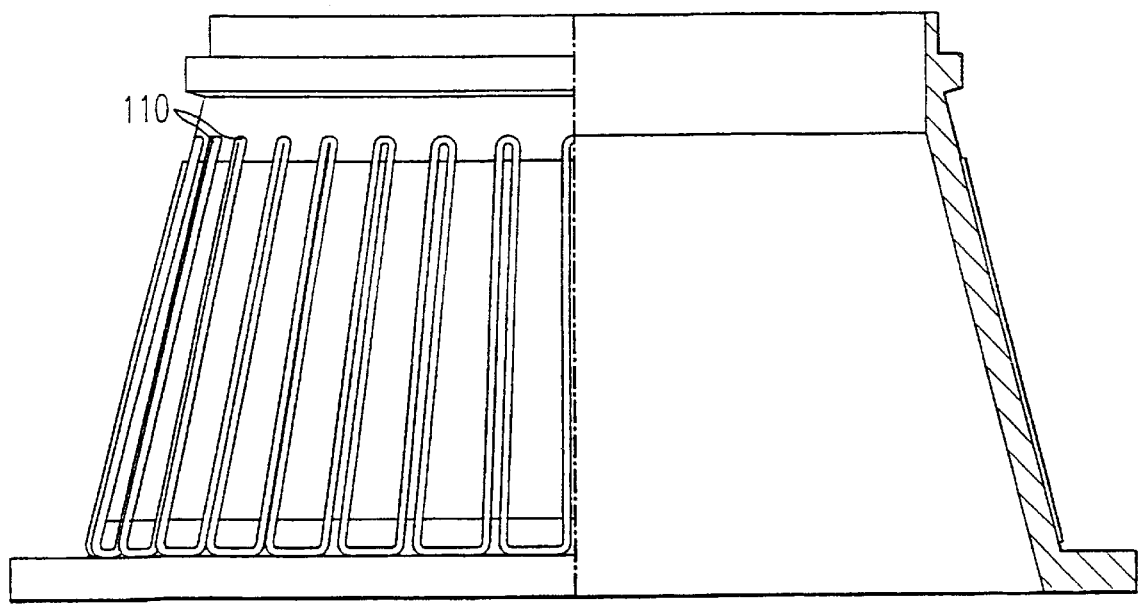
FIG. 1A is a side view of a plasma processing chamber according to the present invention.
Figure 1B:
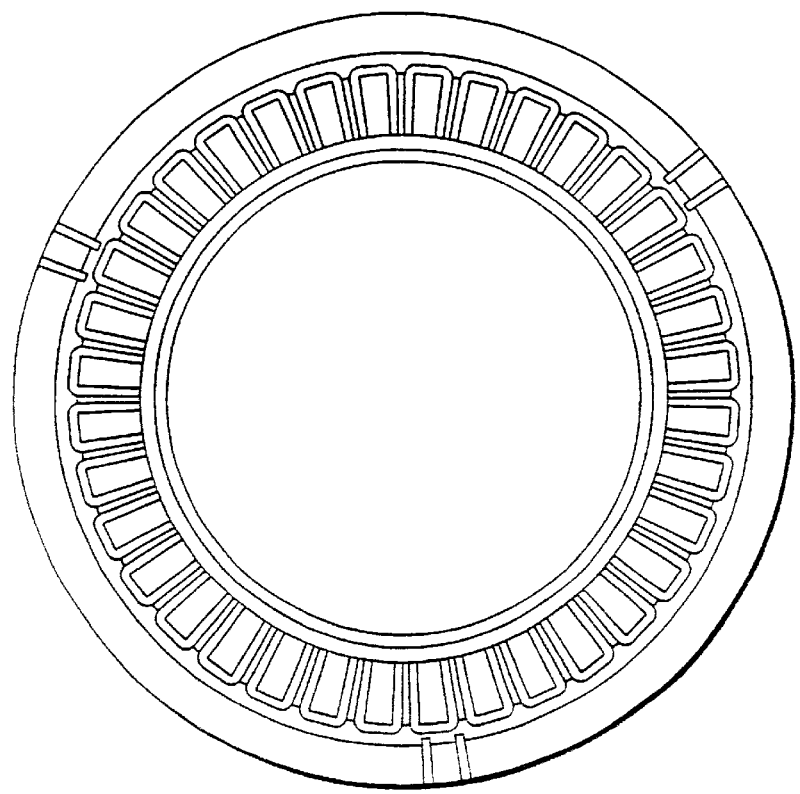
FIG. 1B is a top view of a plasma processing chamber according to the present invention.

Turning now to the drawings in which like reference numerals designate identical or corresponding parts throughout the several views, FIG. 1A is a schematic illustration of a conical process chamber for processing substrates using a plasma. The process chamber may be substantially wider than tall and is illustrated with a portion of the exterior wall exposed to show the serpentine coils 110 of the heating element encased between the exterior wall and the interior wall. FIG. 1B illustrates the same process chamber from above with the exterior wall completely removed to show all the serpentine coils 110 of the heating element. The serpentine coils 110 are directly in contact with the chamber walls. The geometry of the heater is designed to cause the serpentine coils to go up and down the wall of the chamber in order to prevent significant circumferential current paths. This is important for preventing the heater element from shielding inductive RF power applied to the plasma. This process chamber is incorporated into an ESRF source as shown in FIG. 1E.

FIG. 1C is a cross-sectional view of the process chamber and shows the exterior wall 100 and the interior wall 105. The interior wall 105 can be made out of any dielectric material available in that shape. The shape need not be conical but can be domed, straight, cylinder, etc. Currently the preferred materials are fused quartz ($SiO_2$) and alumina ($Al_2O_3$). Inside the process chamber is the plasma area 107 which is under vacuum. The process chamber also includes an electrostatic chuck 120 which connected to a heating and cooling device 125 to control the temperature of the chuck 120. The heating and cooling device 125 can be a source of helium gas, which can be heated or cooled, and flows rapidly on the back side of the substrates during processing. For cleaning purposes, it is sufficient to have the helium simply provide thermal conduction between the substrate on chuck 120. However, for processing, the chuck 120 is attached to an RF power coupling element 123 receiving RF power from an RF power source (not shown). Therefore, the chuck can be biased and/or temperature controlled during all operations. Similarly. capacitively-coupled RF power can be applied to a round gas injection plate (not shown) at the top of the chamber, and that plate can be outfitted with a heater. Thus, it can be cleaned and/or temperature controlled similarly to the interior wall 105 of the cylindrical part of the vessel or the chuck 120.

Figure 1D:
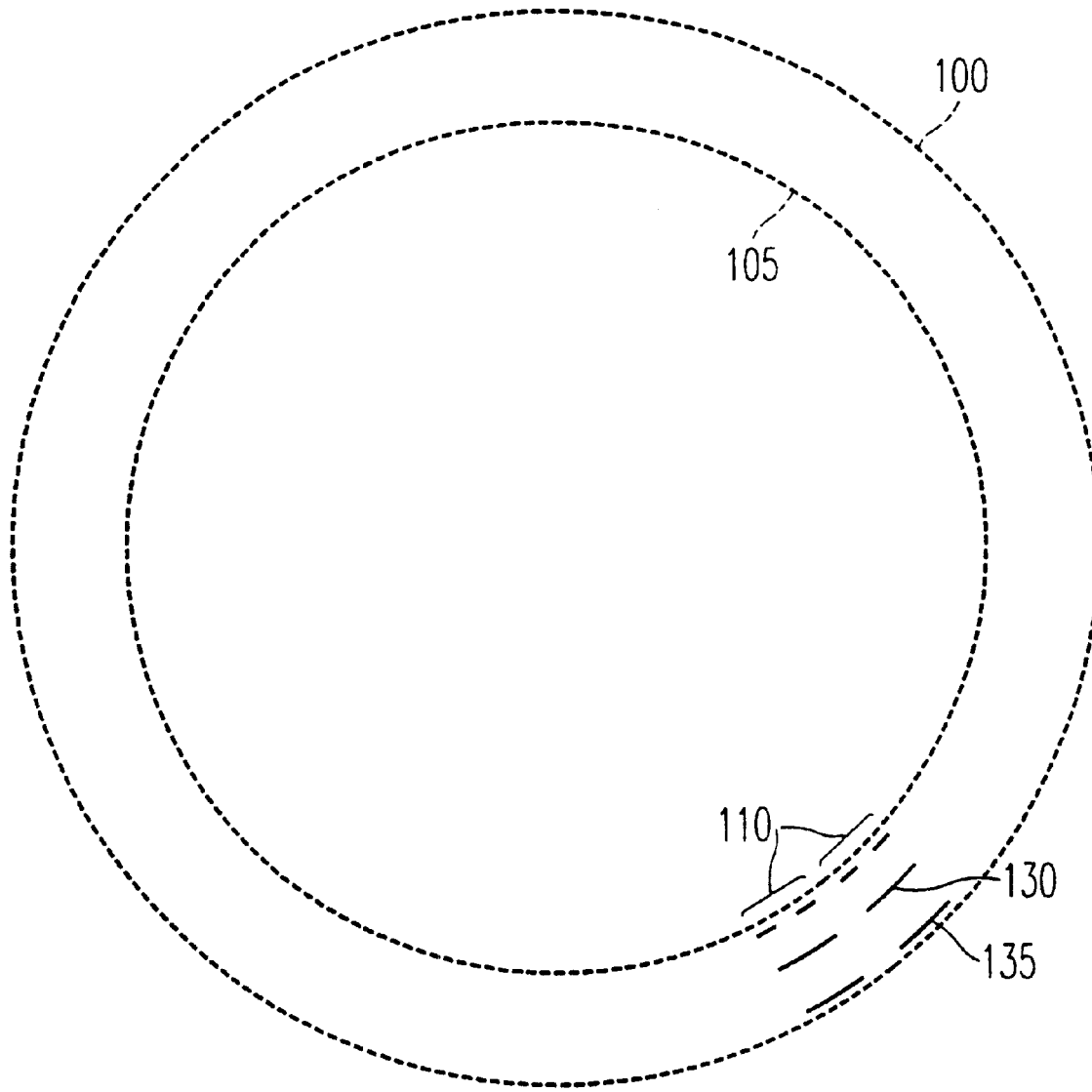
FIG. 1D is a cross-sectional view of a plasma processing chamber according to the present invention where the cross-section has been cut parallel to the top and bottom of the chamber.
Figure 1E:
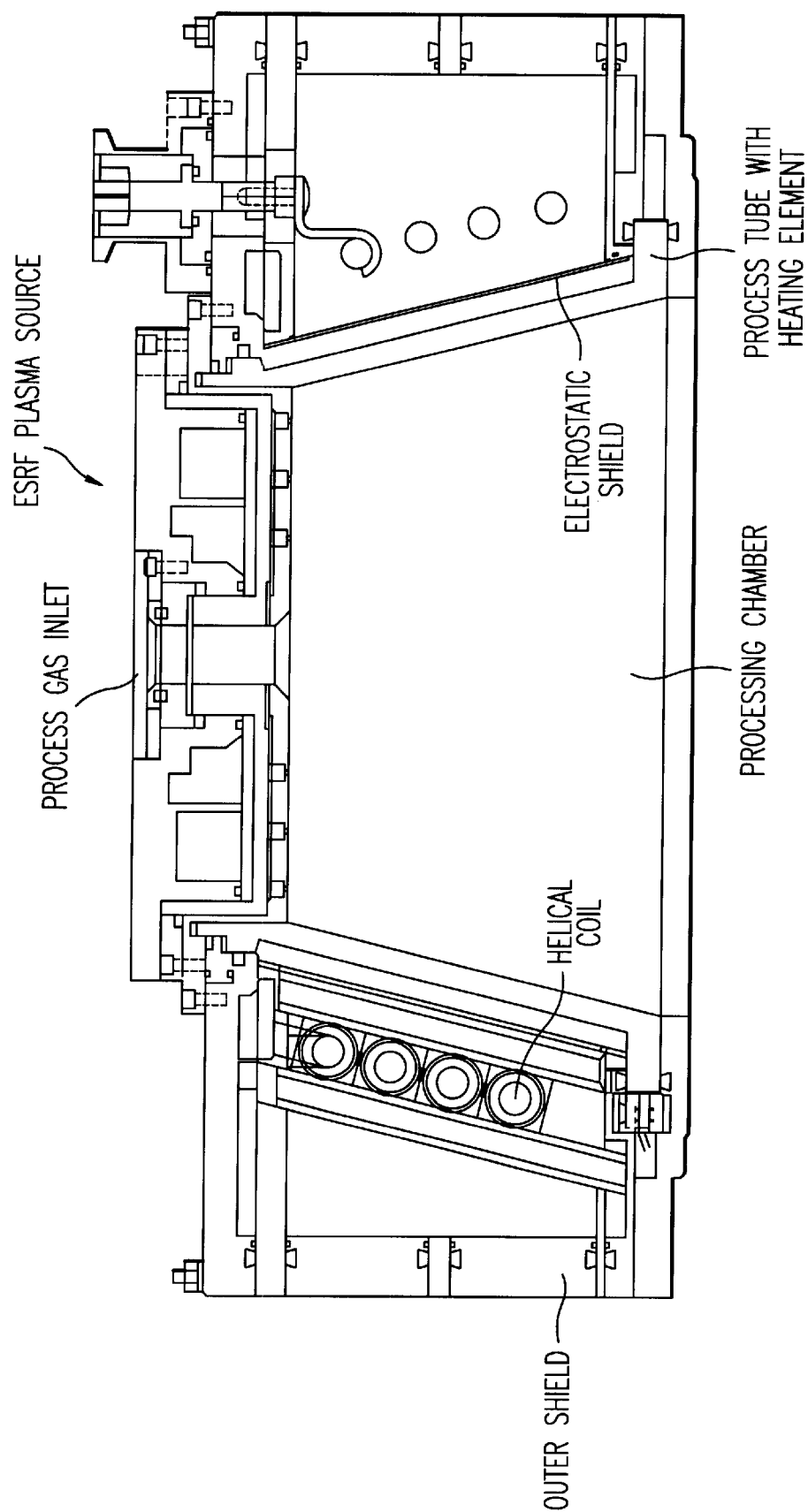
FIG. 1E is a cross-sectional view of a plasma process chamber including an RF power source and an inductive.

FIG. 1D is a second cross-sectional view of the process chamber and shows the different components of the chamber sandwiched between the interior wall 105 and the exterior wall 110. The serpentine coils 10 of the heating element 115 are between the interior wall 105 and the bias shield. The bias shield elements 130 of a slotted bias shield are controllably coupled to ground and an RF power source (not shown). These shield elements 130 are connected to ground when the plasma system is operating in the process mode. However, during cleaning when the bias shield elements 130 are connected to the RF power supply, RF power is coupled capacitively through the dielectric wall of the source which produces a pulsating negative DC bias on the interior wall 105. This bias can be used to direct large quantities of reactive ions to the interior wall 105. By careful selection of the gas species used, and hence the ion species used, virtually any condensate on the interior wall 105 can be removed.

In addition, electrostatic shield elements 135 are sandwiched between bias shield elements 130 and the exterior wall 100. The electrostatic shield elements 135, the bias shield elements 130, and the serpentine coils 110 are all aligned as shown in order to minimize their effect on the induction plasma device fields. The bias shield elements 130 may also be immersed in a fluid that can be heated or cooled. If one wishes to promote desorption of condensates, the fluid can be heated. If, on the other hand, one wishes to promote inner wall reactions with ions, radicals or other species and/or to dissipate large amounts of power, the fluid can be cooled. The electrostatically-shielded radio frequency (ESRF) source. which is the subject of U.S. Pat. No. 5,234,529 issued Aug. 10, 1993 to Wayne L. Johnson (the inventor of the present application), is the only known high-density plasma source to which it is possible to add the capability to heat or cool and/or negatively bias all surfaces of the source. The contents of that patent are incorporated herein by reference.

Further electrostatic shield elements are disclosed in provisional applications entitled "Apparatus and Method for Adjusting Density Distribution of a Plasma," Ser. No. 60/061,856, filed on Oct. 15, 1997; and "Apparatus and Method for Utilizing a Plasma Density Gradient to Produce a Flow of Particles, Ser. No. 60/061,857, filed on Oct. 15, 1997. The contents of these provisional applications are incorporated herein by reference. Also incorporated by reference are the corresponding PCT application filed on Oct. 15, 1998.

Figure 2:
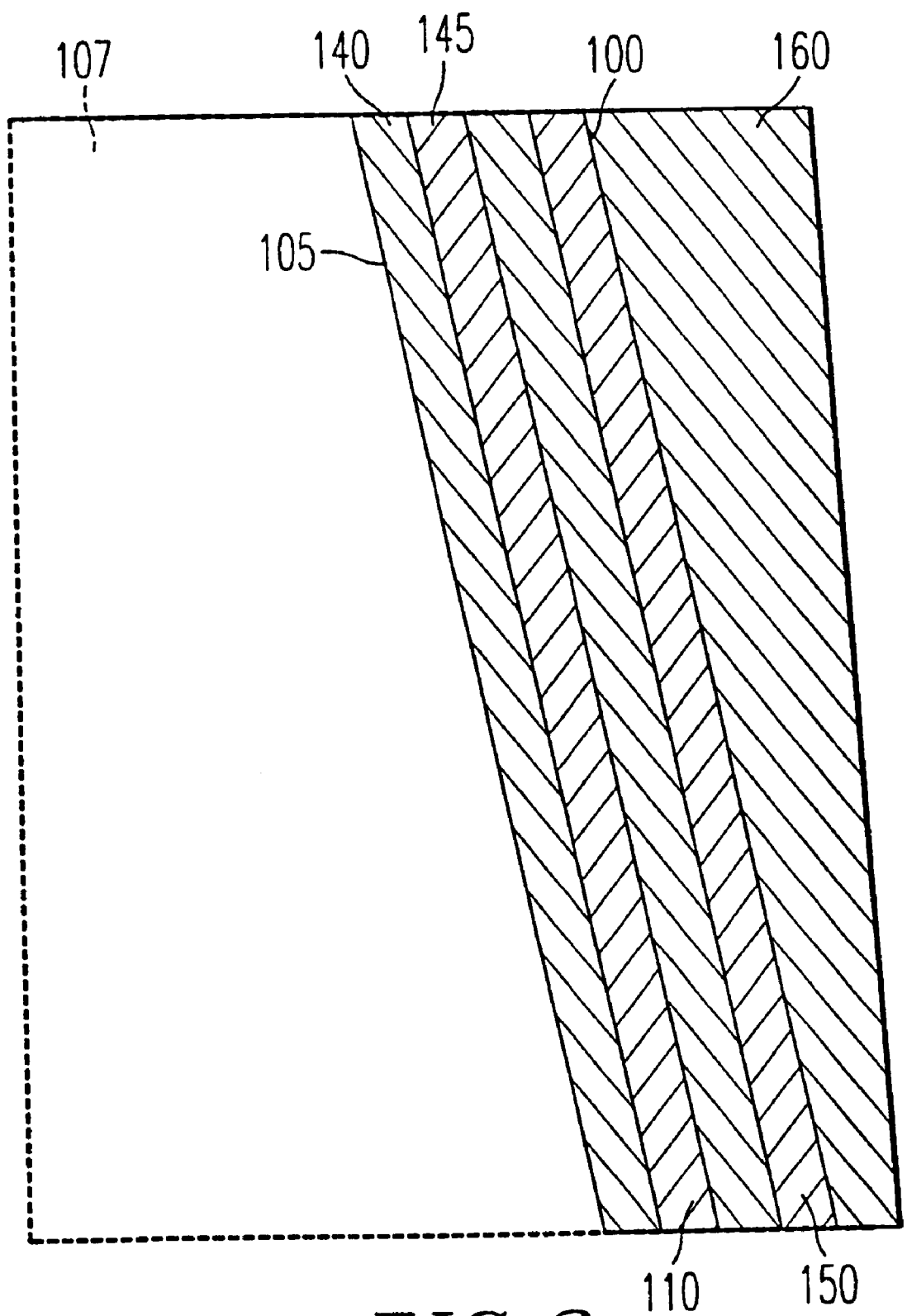
FIG. 2 is an expanded view of the wall of the process chamber circled in FIG. 1C.

FIG. 2 is an expanded view of the circled section of the chamber wall of the process chamber as shown in FIG. 1C. Plasma area 107 is in an interior of the elements of the process chamber wall and is shown for orientation. Each of the layers is described hereinafter starting from an interior of the process chamber. The expanded section includes a ceramic tube 140 with grooves in which the serpentine coils 110 are inlaid. The serpentine coils 110 are covered by a protective ceramic potting 145. An organic thermal barrier 150 isolates the ceramic potting 145 and the heated chamber from an external dielectric cooling fluid 160 surrounding the inductive coil. The organic thermal barrier 150 must be resistant to the coolant. For example, a preferred cooling fluid 160 is fluorinert, so the barrier 150 must be a fluorinert-resistant material.

Figure 3A:
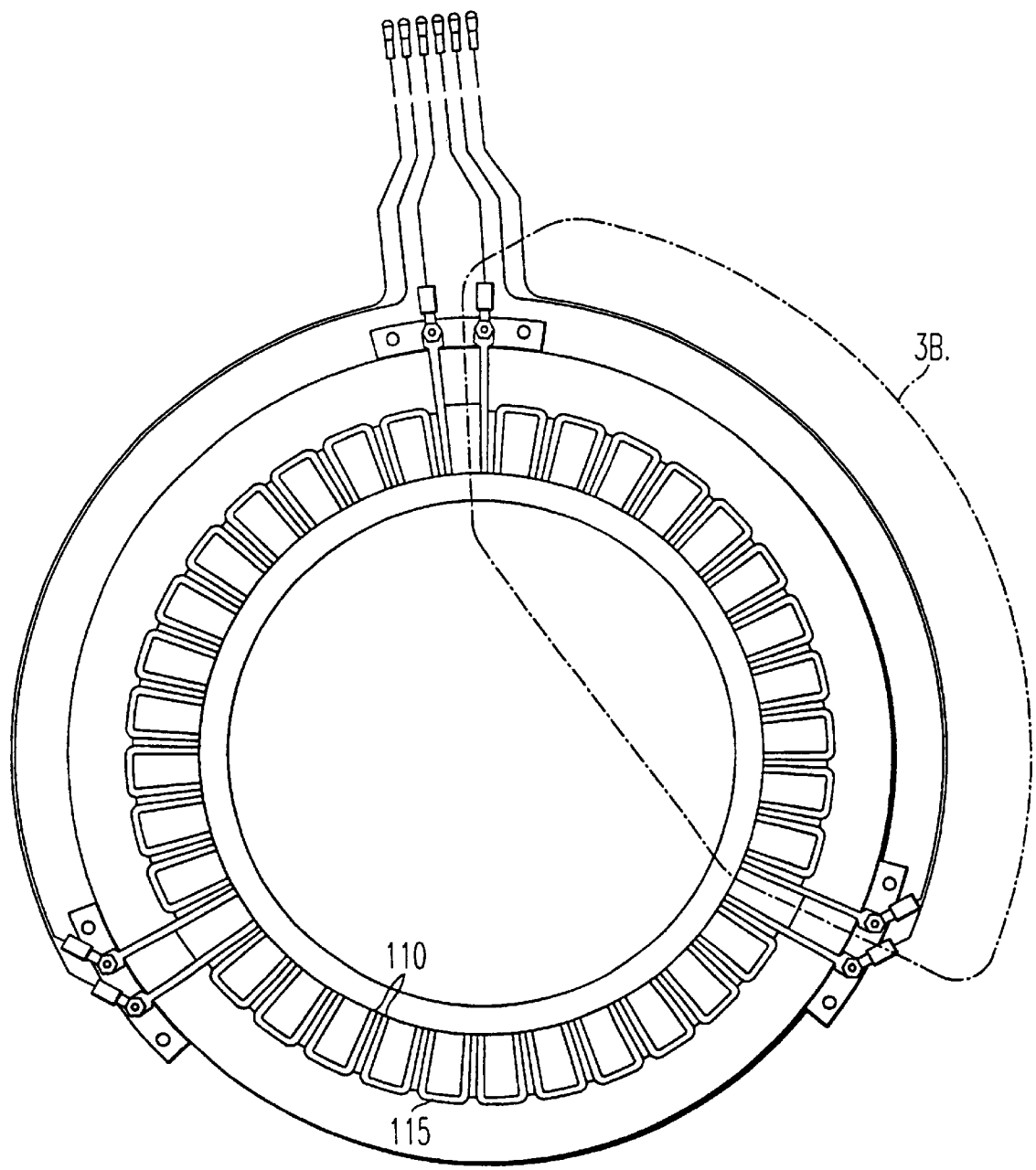
FIG. 3A is a schematic illustration of a heating element surrounding the process chamber.

FIG. 3A shows the serpentine coils 110 of the heating element 115 as they would be configured if encircling the entire process chamber. The heating element can be split into a series of sub-elements—e.g., three sub-elements as shown in FIG. 3B. These sub-elements can be used both during a processing step or during cleaning. This provides better matching to the power supply and better uniformity of heating. Typically each of the sub-elements would be identical. It is also important to fabricate the heating elements such that they have a high resistance for better thermal transfer. In addition, if a material is used that has a resistance that depends on temperature, then the temperature of the heating element can be easily determined by measuring the resistance of the heating element. The heating element can either be fabricated separately and placed into grooves as described above, or the heating element can be fabricated right onto the chamber using sputtered or an evaporated film. In either embodiment, it is important to be able to uniformly heat the process chamber.

Therefore, it can be seen that all internal surfaces of a plasma deposition or etching reactor can be temperature-controlled (hot or cold) and/or biased by capacitive coupling of RF power to the internal surfaces of the chamber. In no other known form of high density source (electron cyclotron resonance, helicon, transformer-coupled power, etc.) is this possible. In none of these cases can the power be capacitively coupled through the cylindrical walls of the process chambers to clean those regions. In some cases there are necessarily magnetic field coils that occupy the space that would have be to occupied by RF electrodes in order to couple power to the inner walls of the cylindrical chambers. In other cases the cylindrical walls of the chamber are metal (typically grounded) through which RF power cannot be coupled. For much the same reasons it is either not possible or exceptionally difficult to heat or cool the inner walls of the cylindrical parts of chambers of all but the ESRF high-density source. The uniqueness of the present invention in this regard is the combination of a dielectric wall, a biasable shield just inside the interior wall, and the fact that the outside surface of the wall can be easily heated or cooled. By using the internal heating element, a number of polymide wall contribution to process gas is reduced, thereby creating a cleaner process. A cleaner process results in less frequent maintenance.

Figure 4:
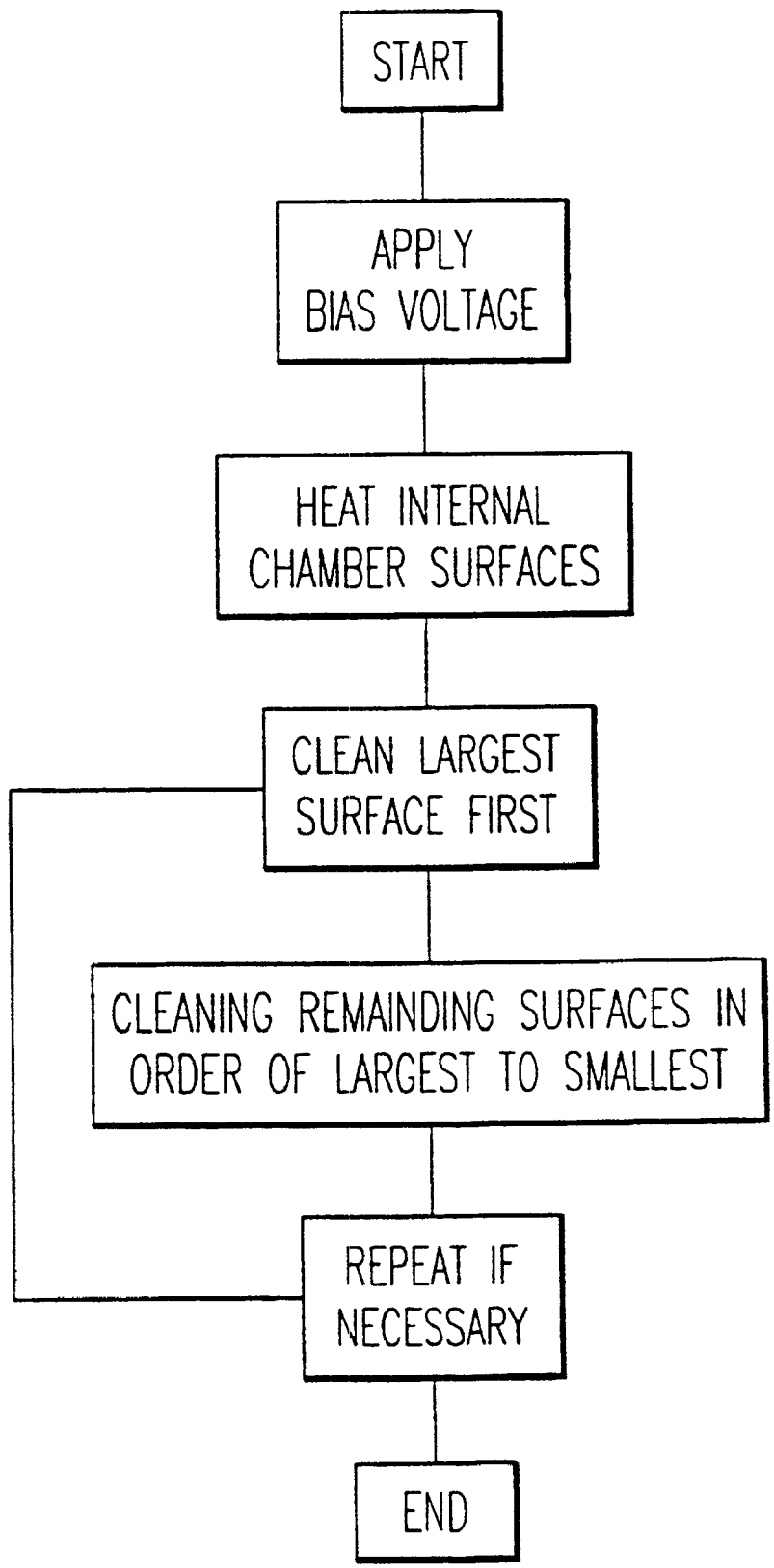
FIG. 4 is a flowchart of the process of cleaning according to the present invention.

The procedures for cleaning in both etch and deposition systems are basically the same. Of course the gases used will differ depending upon what material is to be removed from the internal surfaces. In general the procedure is given by the flowchart of FIG. 4. In the first step of cleaning, a bias voltage is applied to the bias shield. The bias voltage employed should never be high enough to result in physical sputtering of the surfaces. Sputting redistributes wall species and when the wall is clean contaminates the chamber with wall material. All of the removal should occur chemically. Chemical cleaning means that the contamination species are removed from the chamber in the exhaust stream. This implies that the gas pressure used for cleaning should be high (>100 mTorr).

Secondly, all internal chamber surfaces should be heated to minimize recondensation. Further, the surfaces are heated to lessen the chance that condensate removed from one surface will redeposit on another surface. The law of conservation of filth states: "You cannot get anything clean without getting something else dirty; but you can get everything dirty without getting anything clean." This is an application of that law.

Then the surfaces are actually cleaned. The order of cleaning is important. The largest surface should be cleaned first. Typically this is the interior wall 105 of the cylindrical vacuum vessel. Then the next largest surface is treated. Typically this is the gas injector plate. The cleaning process is continued with progressively smaller surfaces until all surfaces have been cleaned. This cycle may be iterated to improve cleaning precision. Typically the process ends when the substrate chuck has been cleaned.

Even with surface heating, recondensation may well occur in certain instances. In those cases, iterative cleaning of different surfaces may be necessary. If iterative cleaning is necessary, the same order should be followed—i.e., cleaning the surfaces from largest to smallest.

The materials of construction of the chamber wall and the gas injection plate are also important. For example, a fused quartz wall reacts with fluorine radicals and ions. If the reactive gas used in e.g. an etching process is $F_2$, reactions of fluorine radicals or ions could change the gas chemistry. This may be desirable or undesirable. If it is undesirable, an alumina tube which will not react with fluorinated species should be used. The material is selected based on the desirability of chemical reactions occurring at the walls.

The control of chemistry at the walls is thought to be a combination of three effects: (1) catalytically-enhanced reactions; (2) bombardment by ions, radicals, energetic neutrals; and (3) adsorption by the wall material through pumping or gettering. Control of these effects can provide better control over the process as a whole.

Obviously, numerous modifications and variations of the present invention are possible in light of the above teachings. It is therefore to be understood that, within the scope of the appended claims, the invention may be practiced otherwise than as specifically described herein.

What is claimed is:

1. A plasma processing system comprising:
   a process chamber including an inner and an outer wall;
   a heating element thermally coupled to the inner wall of the process chamber;
   an electrostatic shield; and
   a bias shield interposed between the electrostatic shield and the heating element.

2. The plasma processing system as claimed in claim 1, further comprising an inductive coupling element for inductively coupling RF power to gas in the process chamber in order to produce a plasma.

3. The plasma processing system as claimed in claim 2, wherein the inductive coupling element is a helical coil.

4. The plasma processing system as claimed in claim 2, wherein the heating element is a serpentine heating element to avoid shielding of the RF power applied by the inductive coupling element.

5. The plasma processing system as claimed in claim 1, further comprising a temperature regulated and electrically-biased substrate holder.

6. A method of cleaning a plasma processing system having a processing chamber including a bias shield and a heater element coupled to an inner wall of the process chamber, the method comprising the steps of:
   applying a bias voltage to the bias shield to produces a pulsating negative DC bias on the interior wall;
   heating the inner wall of the process chamber using the heater element;
   injecting a cleaning gas into the processing chamber; and
   cleaning each of plural internal surfaces starting with a largest of the plural internal surfaces and decreasing in size until a last of the plural internal surfaces has been cleaned.

7. The method according to claim 6, further comprising the step of measuring a cleanliness of the process chamber after the cleaning step.

8. The method according to claim 7, further comprising the step of repeating the cleaning step at least one additional time to further clean the process chamber before a new substrate is added if the step of measuring determines that the process chamber is not sufficiently clean.

9. The method according to claim 6, wherein the steps of applying the bias voltage and heating the inner wall are performed in combination during a process to control wall depositions.

* * * * *